455/6

United States Patent [19]

Wright

[11] 3,710,260

[45] Jan. 9, 1973

[54] SOLID STATE RECEIVING MULTICOUPLER

[75] Inventor: Charles S. Wright, Springfield, Va.

[73] Assignee: Delta Electronics Inc., Alexandria, Va.

[22] Filed: Feb. 16, 1971

[21] Appl. No.: 115,162

[52] U.S. Cl. .........325/308, 178/DIG. 13, 179/2.5 B, 328/105

[51] Int. Cl. .............................................H04b 1/12

[58] Field of Search.........178/DIG. 13; 179/1 B, 1 C, 179/2 C, 2.5 B; 325/301, 308, 373, 376, 381, 385, 309; 328/105, 106; 330/152, 156

[56] References Cited

UNITED STATES PATENTS

| | | | |
|---|---|---|---|
| 3,382,439 | 5/1968 | Frihart | 325/308 |
| 2,725,534 | 11/1955 | Hemphill | 330/155 |
| 3,392,335 | 7/1968 | Eller et al. | 325/308 |
| 3,094,668 | 6/1963 | Sontheimer | 328/105 |

*Primary Examiner*—Albert J. Mayer

*Attorney*—Munson H. Lane and Munson H. Lane, Jr.

[57] ABSTRACT

A solid state receiving multicoupler for providing a plurality of output signals from a single signal source comprising in combination a first transistor emitter follower circuit, a second transistor emitter follower circuit connected in cascade with said first transistor emitter follower circuit and a plurality of parallel output transistor emitter follower circuits connected in cascade with said second transistor emitter follower circuit; each of said transistor emitter follower circuits including a single transistor having a base, a collector, and an emitter; each of said emitter follower circuits further including a base input circuit, an emitter output circuit, and means connecting said collector in common to said base input circuit and said emitter output circuit at a common reference point, input means for coupling said single signal means to the base input circuit of said first transistor emitter follower circuit, and a signal output coupling means in each output transistor emitter follower circuit for coupling a separate signal receiver across the emitter output circuit of a respective output transistor emitter follower circuit.

10 Claims, 1 Drawing Figure

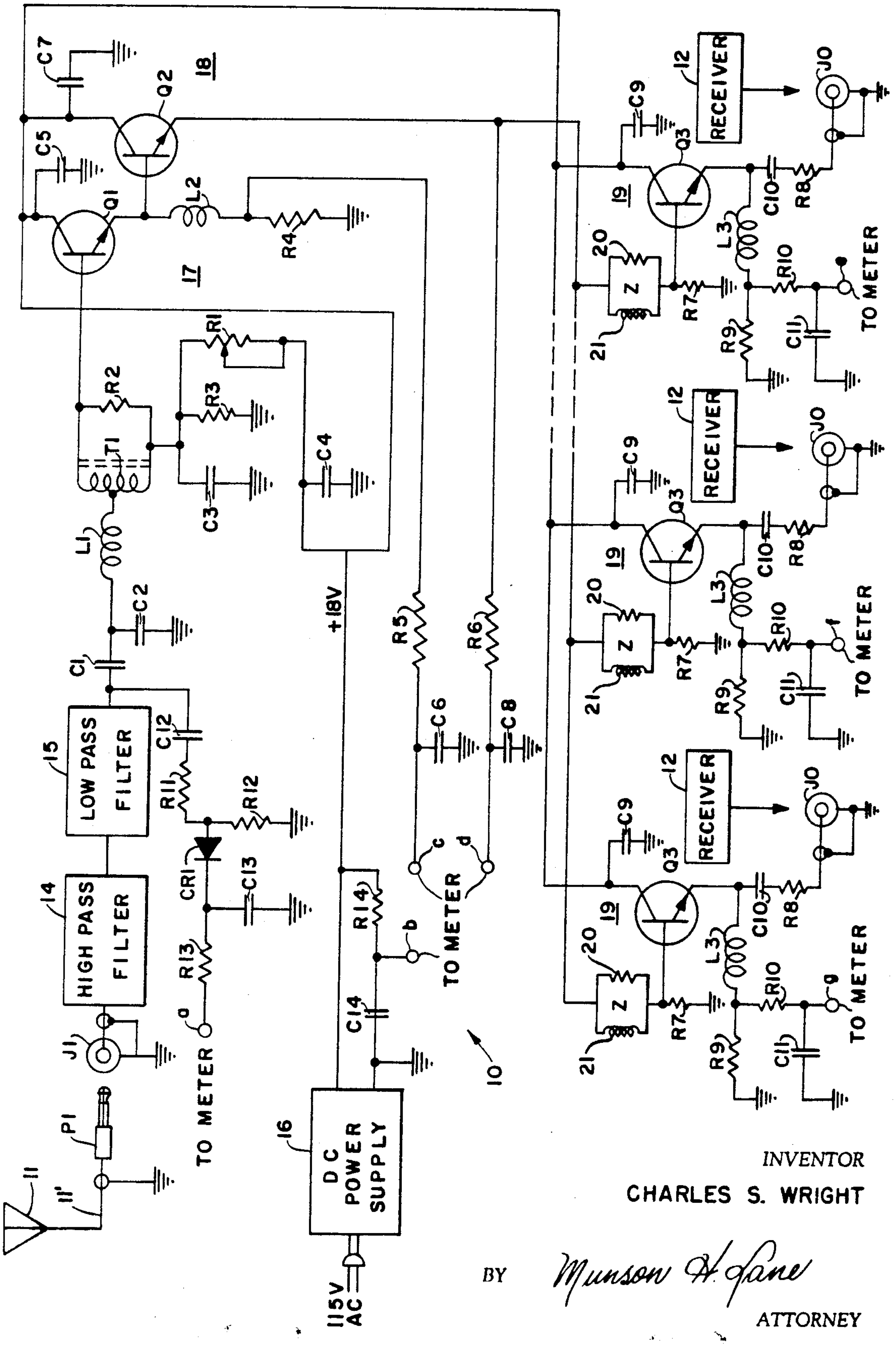
INVENTOR
CHARLES S. WRIGHT
BY Munson H. Lane
ATTORNEY

SOLID STATE RECEIVING MULTICOUPLER

This invention relates to an improved solid state high frequency receiving multicoupler designed to provide coupling between a single signal source and multiple communication receivers.

The need for receiving multicouplers to connect a single antenna to multiple communication receivers has long been recognized and many multicouplers have been designed and are disclosed in the prior art. Requirements of a satisfactory multicoupler are high linearity over the frequency range for which the multicoupler is designed, good circuit stability which will prevent noise developing within the multicoupler, high isolation between output circuits to provide a minimum of interaction between receivers and a minimum of re-radiation into the antenna.

With the development of solid state devices transistors were incorporated in the design of multicouplers. However, the prior art multicouplers which include transistors, commonly utilize the transistors in push-pull arrangements and to the inventor's knowledge have not heretofore successfully utilized single ended transistor amplifiers connected in cascade in emitter follower circuit.

It is therefore an object of this invention to provide an improved solid state high frequency receiving multicoupler which will provide a minimum of interaction between receivers as well as a minimum of re-radiation into the antenna, and will permit operation in the presence of high intensity RF signals with minimum intermodulation distortion, noise, and sensitivity to undesired RF signals.

It is another object of this invention to provide a receiving multicoupler having plural transistor amplifier stages connected in cascade with multiple output channel transistor amplifiers connected in parallel in the last amplifier stage, with all amplifier stages being direct coupled, single ended, emitter-follower circuits.

It is another object of this invention to provide very high frequency isolation in all of the parallel output channel amplifiers by providing parallel resistor coil combinations in the emitter to base circuit connecting each of the output channel transistor amplifiers with a preceding driver amplifier stage.

It is another object of this invention to provide static loading of each of the transistor amplifiers without excessive dynamic loading by connecting a coil and resistor in series to ground in the emitter circuit of each amplifier.

The multiple transistor amplifier stages of this invention which are directly coupled in single ended emitter follower circuits provide very high feedback in the order of 100 percent. As a result of high feedback and high current gain the multicoupler has a high degree of linearity, very low output impedance, and very high input impedance. The feedback from the successive cascade connected amplifier stages is accumulative and thus the total feedback is increased with each successive amplifier stage.

With the foregoing more important objects and features in view and such other objects and features as may become apparent as this specification proceeds, the invention will be understood from the following description taken in conjunction with the accompanying drawing wherein like characters of reference are used to designate like parts.

The receiving multicoupler which is illustrated in the drawing is particularly designed for operation in the 2–30 MHz frequency range, however the multicoupler of this invention can be designed to operate in other frequency bands by proper selection of circuit parameters. The multicoupler of this invention will be useful in many fields of communication within the operating frequency range for which it is designed.

Referring now to the drawing the receiving multicoupler of this invention, indicated by the reference numeral 10, is adapted to have its signal input jack J1 connected to a single receiving antenna 11 via a conventional coaxial antenna cable 11' and coaxial plug P1, and its multiple output jacks J0 each connected to one of multiple communication receivers 12. The number of output circuits provided in the multicoupler 10 will depend on the customer service required, but it should be recognized that the multicoupler of this invention can be built to accommodate many output connections to communication receivers. In usual practice the multicoupler 10 will have a predetermined number of output circuits (for example 10) built into it and one or more receivers can be connected to the multicoupler in accordance with the user's needs. For optimum utilization of the multicoupler however, receivers will be connected to each of the output jacks J0.

The multicoupler 10 is provided with a voltage and current regulated power supply 16 which provides a regulated DC voltage output of predetermined value, 18 volts positive being given as illustrative of the requirements of one specific circuit design.

Incorporated in the 72 ohm coaxial input circuit from the input signal jack J1 are a high pass filter 14, and a low pass filter 15. The high pass filter 14 is designed with a cut-off frequency of 2 MHz and provides attenuation of 60 db or greater below 1.5 MHz. The low pass filter is designed with a cut-off frequency of 30 MHz and attenuates frequencies above 45 MHz by 40 db or more. The signals passing through the high pass and low pass filters are fed to the ferrite core auto transformer T1 which transforms the impedance level from the 72 ohm input to a 350 ohm output level. This accomplishes a voltage gain of slightly more than 6 db. The transformer T1 is terminated in a 350 ohm deposited film resistor R2. A slight capacity loading is placed on the output of the transformer by the base of the input transistor Q1, and circuit strays. This loading, however is small because of the emitter follower configuration of the amplifier. The input impedance characteristics of the transformer T1 is compensated by coil L1 and capacitor C2 to provide an excellent impedance match into the amplifier over the operating frequency range (i.e. 2–30 MHz).

The auto-transformer T1 feeds into the first stage 17 of the multicoupler solid state amplifier which comprises a pair of drive amplifiers 17 and 18 and multiple parallel connected output amplifiers 19, there being one output amplifier 19 for each output channel. All of the amplifier stages 17, 18 and 19 are direct coupled, single ended, emitter follower circuits so that the current in all stages is set by adjusting one bias resistor R1 in the bias voltage divider network comprising resistors R1 and R3.

Each of the amplifier stages 17, 18 and 19 includes a single transistor of like characteristics having a base, a collector and an emitter. Transistors Q1 and Q2 are in the first and second driver amplifier stages 17 and 18 respectively and the transistors Q3 are in the multiple parallel connected output stages 19. Since each of the parallel connected output stages 19 are substantially identical they will be given the same reference designation in the drawing as will the corresponding components of each output stage. The total number of parallel connected output amplifier stages 19 is selected according to the requirements of a specific practical situation.

The collectors of each of the transistors Q1, Q2 and Q3 are connected to the +18 volts from the DC power supply, and are connected through high frequency shunting capacitors C5, C7 and C9 respectively to ground.

Bias voltage from the voltage divider network R1 and R3 is applied to the base of the first amplifier stage transistor Q1 through the resistor R2 and auto transformer T1 is parallel. Capacitors C3 and C4 are RF shunting capacitors provided to keep RF signals out of the DC power supply. The emitter output of the first stage transistor Q1 is directly coupled to the base of the second amplifier stage transistor Q2 and the emitter output of the second stage transistor Q2 is connected directly to the base of all output channel amplifier transistors Q3 in parallel. Very high frequency isolation is provided by the parallel resistor-coil combinations Z in the emitter to base circuits between Q2 and each of the output amplifier transistors Q3. The resistor-coil combination Z prevents spurious oscillation from developing in the multicoupler amplifiers and is an important adjunct to the invention. The network Z is a low pass filter, the value of the coil 21 being selected to have a low impedance at the low frequency end of the operation frequency range and a high impedance at the high frequency end of the operating frequency range.

Static and dynamic loading of the first driver amplifier stage 17 is provided by the coil L2 and the resistor R4 connected in series between the emitter of transistor Q1 and ground. The radio frequency and direct current load for the second driver amplifier stage 18 in the operating frequency range is provided by the base resistors R7 in each of the output channel amplifiers 19 in series connection with the impedance Z between the emitter of transistor Q2 and ground. Dynamic and static loading for each output channel amplifier 19 is provided by the coil L3 and resistor R9 connected in series between the emitter of each output channel amplifier transistors Q3 and ground.

The output signal of each channel amplifier 19 is connected through a coupling capacitor C10 and series resistor R8 to an output jack J0 and to any receivers 12 which are connected to the multicoupler through the output jacks J0. The resistance value of the resistors R8 is chosen so that the resistor R8 reduces the output voltage to approximately the same value as the input voltage. The arrangement of resistor R8 in the output circuit of the output channel amplifiers provides excellent output VSWR (Voltage Standing Wave Ratio) characteristics and also protects the output amplifier from short circuit overloads.

The overall voltage gain from the base of the first emitter follower transistor Q1 to the emitter of any output channel amplifier 19 is approximately zero db. This is maintained extremely constant by the 100 percent feedback of the emitter follower circuits. The transistors Q1, Q2 and Q3 used in the amplifier stages 17, 18 and 19 have a gain-bandwidth product of 1,500 MHz giving the entire amplifier (stages 17, 18 and 19 combined) an overall current gain in excess of 100 db at 30 MHz. This very high current gain and 100 percent feedback results in very high circuit linearity and stability. The emitter follower configuration of the various amplifier stages also provides a low source impedance at the output of each stage providing the high degree of isolation obtained in the multicoupler of this invention.

A useful adjunct of the receiving multicoupler 10 will be a meter (not shown) which permits measurement of the current of all amplifier transistors, the power supply voltage and the RF input voltage level for the multicoupler 10. A suitable meter would be one having a 100 micro ampere movement. Collector currents are monitored by sampling the DC voltage across the emitter resistor for each amplifier stage. Appropriate meter multiplier resistors R5, R6 and R10 are provided for the amplifier stages 17, 18 and 19 respectively so that normal collector current will cause a mid scale deflection of the meter. The amplifier also includes a diode rectifier circuit including diode CR1, resistors R11, R12 and R13 and capacitors C12 and C13 for measuring the RF input level to the multicoupler. The multiplier resistor R14 is provided for measuring a positive 18 volt regulated power supply output and its value is selected so that the meter will deflect the mid scale for correct power supply voltage.

A meter will normally be mounted on the front panel of the multicoupler housing (not shown) and connected through a selector switch (not shown) to selectively sample the test points a through g indicated in the drawing. Circuits in which malfunction has developed can quickly be isolated by means of a meter and meter selector switch which sample the test points a through g.

The multicoupler operating characteristics as stated in this specification have been obtained using RCA 2N5109 transistors in all amplifier stages and other component values as follows:

| | | |
|---|---|---|
| Capacitors C1, C3, C4, C5, C6, C7, C8, C9, C11, C13 and C14, each | uf | 0.01 |
| Capacitor C2 | Pf | 2 |
| Capacitor C10 | uf | 0.047 |
| Capacitor C12 | uf | 0.005 |
| Resistors R1, R7 and R11 | ohms | 1000 |
| Resistor R2 | ohms | 348 |
| Resistor R3 | ohms | 470 |
| Resistor R4 | ohms | 681 |
| Resistors R5 and R9 | ohms | 150 |
| Resistor R6 | kiloohms | 140 |
| Resistor R8 | ohms | 68 |
| Resistor R12 | kiloohms | 33 |
| Resistor R13 | kiloohms | 83 |
| Resistor R14 | ohms | 360 |
| Inductances L2 and L3 | uh at 2.5 MHz | 33 |

Since inductor L1 and capacitor C2 are provided to compensate for imperfections in the autotransformer T1 their values will be selected to provide compensation for a specific autotransformer.

While a specific operating frequency range has been indicated and component values have been given for a specific multicoupler operating within the designated frequency range, it is not intended that the invention be so specifically limited. Other operating frequency ranges may be chosen for a particular situation and component values can be selected which will meet the requirements of the selected operating frequency range and still fall within the scope and intention of this invention.

While in the foregoing one specific multicoupler embodiment has been described and illustrated, various modifications may become apparent to those skilled in the art to which the invention relates. Accordingly, it is not desired to limit the invention to this disclosure and various modifications and equivalents may be resorted to falling within the spirit and scope of the invention as claimed.

What is claimed is:

1. A solid state receiving multicoupler for providing a plurality of output signals from a single signal source comprising in combination a first transistor emitter follower circuit, a second transistor emitter follower circuit connected in cascade with said first transistor emitter follower circuit and a plurality of parallel output transistor emitter follower circuits connected in cascade with said second transistor emitter follower circuit; each of said transistor emitter follower circuits including a single transistor having a base, a collector, and an emitter; each of said emitter follower circuits further including a base input circuit, an emitter output circuit, and means connecting said collector in common to said base input circuit and said emitter output circuit at a common reference point, input means for coupling said single signal source to the base input circuit of said first transistor emitter follower circuit, and a signal output coupling means in each output transistor emitter follower circuit for coupling a separate signal receiver across the emitter output circuit of a respective output transistor emitter follower circuit, each of said emitter output circuits including an inductor and a resistor connected in series circuit between the emitter of the respective emitter follower circuit transistor and the common reference point, said resistor providing a static load for the respective emitter follower circuit and said inductor providing a high impedance to said signal, the base of the transistor in said second transistor emitter follower circuit being directly coupled to the emitter of the transistor in said first transistor emitter follower circuit, and separate impedance network means being provided in circuit between the emitter of said second emitter follower circuit transistor and the base of each of said output emitter follower circuit transistors for circuit isolation and stabilization, said impedance network means comprising a resistor in parallel with the inductor included in the emitter output circuit of said second emitter follower circuit.

2. The multicoupler set forth in claim 1 wherein an adjustable base bias means is provided in said first transistor emitter follower circuit.

3. The multicoupler set forth in claim 1 wherein said signal output coupling means includes a capacitor and resistor connected in series with an output jack.

4. The multicoupler set forth in claim 3 wherein said input coupling means includes a step up transformer means for stepping up the signal voltage to compensate for the signal voltage drop across the resistors in said output coupling means.

5. The multicoupler set forth in claim 1 wherein all of said transistors have substantially similar characteristics.

6. The multicoupler set forth in claim 5 wherein all of said transistors are NPN transistors, and a current and voltage regulated positive direct current source is connected to the collector of each transistor in all of said emitter follower circuits.

7. The multicoupler set forth in claim 1 wherein said input coupling means includes filter means for passing signals within a predetermined frequency band.

8. The multicoupler set forth in claim 1 wherein the circuit parameters of said multicoupler provide an overall voltage gain from the base of the transistor of said first emitter follower circuit to the emitter output of any one of said output emitter follower circuits is approximately zero and wherein the transistors each have a gain bandwidth product of 1,500 MHz giving the multicoupler an overall current gain in excess of 100 db at 30 MHz, and wherein said cascade connected emitter follower circuits inherently provide approximately 100 percent feedback, said high current gain and approximately 100 percent feedback resulting in high circuit linearity and stability.

9. The multicoupler set forth in claim 1 wherein said signal source is a single receiving antenna.

10. A solid state receiving multicoupler operating in a selected frequency range and operative to prevent spurious oscillations at high frequencies than said selected frequency range for simultaneously coupling RF signals between an RF signal source and plural receivers, comprising signal input means for connection to said RF signal source and passing RF signals within a predetermined RF signal band while attenuating other RF signals lying outside of said band, amplifier means for amplifying said band of RF signals, said amplifier means comprising a driver amplifier having a signal input terminal connected to receive RF signals from said signal input means and a signal output, a plurality of parallel connected output amplifiers each of which is directly coupled to the output of said driver amplifier through a high frequency isolation and stabilization network including an inductor and resistor in parallel, said driver amplifier having at least one driver amplifier stage consisting of a transistor connected in a single ended emitter follower circuit, each of said plurality of parallel connected output amplifiers including a transistor connected in a single ended emitter follower circuit, and means for coupling RF signals from each of said plurality of parallel connected amplifiers to a separate one of said plural receivers.

* * * * *